(12) United States Patent
Jung et al.

(10) Patent No.: US 11,845,912 B2
(45) Date of Patent: Dec. 19, 2023

(54) CLEANING LIQUID COMPOSITION AND CLEANING METHOD USING SAME

(71) Applicant: KCTECH CO., LTD., Gyeonggi-do (KR)

(72) Inventors: Ga Young Jung, Gwangju (KR); Yong Ho Jeong, Busan (KR); Kun Hee Park, Gyeonggi-do (KR); Young Gon Kim, Busan (KR); Young Ho Yoon, Gyeonggi-do (KR); Young Lok Yoon, Gyeonggi-do (KR)

(73) Assignee: KCTECH CO., LTD., Gyeonggi-do (KR)

( * ) Notice: Subject to any disclaimer, the term of this patent is extended or adjusted under 35 U.S.C. 154(b) by 255 days.

(21) Appl. No.: 17/416,420

(22) PCT Filed: Aug. 7, 2019

(86) PCT No.: PCT/KR2019/009841
§ 371 (c)(1),
(2) Date: Jun. 18, 2021

(87) PCT Pub. No.: WO2020/130266
PCT Pub. Date: Jun. 25, 2020

(65) Prior Publication Data
US 2022/0056373 A1    Feb. 24, 2022

(30) Foreign Application Priority Data

Dec. 21, 2018 (KR) .................. 10-2018-0167285

(51) Int. Cl.
| C11D 1/37 | (2006.01) |
| C11D 3/20 | (2006.01) |
| C11D 1/14 | (2006.01) |
| C11D 1/34 | (2006.01) |
| C11D 3/34 | (2006.01) |
| C11D 3/36 | (2006.01) |
| C11D 11/00 | (2006.01) |

(52) U.S. Cl.
CPC ............ *C11D 3/2075* (2013.01); *C11D 1/146* (2013.01); *C11D 1/345* (2013.01); *C11D 3/2093* (2013.01); *C11D 3/3409* (2013.01); *C11D 3/36* (2013.01); *C11D 11/0047* (2013.01)

(58) Field of Classification Search
CPC .................................................. C11D 11/0047
USPC ......................................................... 510/175
See application file for complete search history.

(56) References Cited

U.S. PATENT DOCUMENTS

2010/0261632 A1* 10/2010 Korzenski ........... C11D 11/0047
                                                          510/175
2012/0083436 A1    4/2012 Lee

FOREIGN PATENT DOCUMENTS

| CN | 1271000 A | 10/2000 |
| CN | 1566307 A | 1/2005 |
| CN | 1875090 A | 12/2006 |
| CN | 102007196 A | 4/2011 |
| CN | 102245750 A | 11/2011 |
| CN | 103074175 A | 5/2013 |
| CN | 105283531 A | 1/2016 |
| CN | 105754745 A | 7/2016 |
| CN | 106047525 A | 10/2016 |
| CN | 106753873 A | 5/2017 |
| JP | 2010163608 A | 7/2010 |
| KR | 19980014483 A | 5/1998 |
| KR | 20140139498 A | 12/2014 |
| KR | 20160097201 A | 8/2016 |
| TW | 202014510 A | 4/2020 |

OTHER PUBLICATIONS

International Search Report for Patent Application No. PCT/KR2019/009841, dated Nov. 19, 2019, 2 pages.

* cited by examiner

*Primary Examiner* — Gregory E Webb
(74) *Attorney, Agent, or Firm* — KDW Firm PLLC

(57) ABSTRACT

The present disclosure relates to a cleaning liquid composition and a cleaning method using the same. A polishing slurry composition according to an embodiment of the present disclosure includes: a chelating agent containing an organic salt; and an anionic surfactant.

8 Claims, No Drawings

CLEANING LIQUID COMPOSITION AND CLEANING METHOD USING SAME

TECHNICAL FIELD

The present disclosure relates to a cleaning liquid composition, and more particularly, to a cleaning liquid composition used in a surface treatment process performed after a chemical mechanical polishing (CMP) process of a wafer for a semiconductor device and before a cleaning process, and to a cleaning method using the cleaning liquid composition.

BACKGROUND ART

A microelectronic device wafer is used to form an integrated circuit. The microelectronic device wafer includes a wafer, such as silicon, in which regions for deposition of different materials having insulative, conductive or semiconductive properties are patterned. To obtain correct patterning, excess material used to form layers on the wafer need to be removed. In addition, to fabricate a functional and reliable circuit, it is important to prepare a flat or planar microelectronic wafer surface prior to subsequent processing. Thus, it is necessary to remove and/or polish a specific surface of a microelectronic device wafer.

Chemical mechanical polishing (CMP) is a process in which a material is removed from a surface of a microelectronic device wafer and in which the surface is polished by coupling a physical process such as polishing with a chemical process such as oxidation or chelation. In its most rudimentary form, CMP involves applying a slurry such as a solution of an active compound and an abrasive to a polishing pad that buffs the surface of the microelectronic device wafer to achieve removal, planarization, and polishing processes. In fabrication of integrated circuits, a CMP slurry also needs to be able to preferentially remove films that include complex layers of metals and other materials so that highly planar surfaces may be generated for subsequent lithography, or patterning, etching and thin-film processing.

Meanwhile, to remove contaminants such as particles, metal atoms, organic materials, and the like generated in a process of manufacturing a semiconductor device, and to enhance reliability of a device, a cleaning process may be performed. Since OH— is abundantly present in an alkaline aqueous solution, a cleaning liquid composition generally used for cleaning after polishing may charge abrasive particles and a wafer surface to facilitate a removal of abrasive particles through electrical repulsion, however, impurities such as metal contaminants, organic residues, and the like on the wafer surface that is cleaned are not effectively removed. Also, if pH of the cleaning liquid composition is 8 or greater, roughness of the wafer surface tends to increase due to an etching process by a basic compound. Therefore, there is a need for a cleaning liquid composition that may effectively remove residual particles, organic contaminants and metal contaminants while minimizing a loss of a surface.

DISCLOSURE OF INVENTION

Technical Goals

To solve the above-described problems, an aspect of the present disclosure is to provide a cleaning liquid composition and a cleaning method using the cleaning liquid composition which may remove defects, residual particles, organic contaminants, and metal contaminants while minimizing a loss of a surface of a wafer for a semiconductor device in a cleaning process performed after chemical mechanical polishing (CMP) of the wafer.

However, aspects of the present disclosure are not limited to the one set forth herein, and other aspects not mentioned herein would be clearly understood by one of ordinary skill in the art from the following description.

Technical Solutions

According to an aspect of the present disclosure, there is provided a cleaning liquid composition including: a chelating agent including an organic salt; and an anionic surfactant.

According to an example embodiment, the chelating agent may include at least one organic salt selected from a group consisting of a carboxyl group, a carbonic acid group, a phosphoric acid group, and a sulfuric acid group; or an ammonium salt thereof.

According to an example embodiment, the organic salt containing the carboxyl group may include at least one selected from a group consisting of acetate, citrate, hydrogen citrate, tartrate, oxalate, lactate, benzonate, formate, phthalate, and malate.

According to an example embodiment, the organic salt containing the carbonic acid group may include at least one selected from a group consisting of carbonate, bicarbonate, tricarboante, ethylcarbonate, 2-cyanoethylcarbonate, octadecylcarbonate, dibutylcarbonate, dioctadecylcarbonate, methyldecylcarbonate, hexamethylene iminecarbonate, mopholinium morpholinecarbonate, benzylcarbonate, triethoxy silylpropylcarbonate, pyridinium ethylhexyl bicarbonate (pyridinium ethylhexylcarbonate), and triethylene diaminium bicarbonate.

According to an example embodiment, the organic salt containing the phosphoric acid group may include at least one selected from a group consisting of phosphate, hydrogen phosphate, diammonium hydrogen phosphate, triammonium hydrogen phosphate, monobutyl phosphate, monoamyl phosphate, monononyl phosphate, monocetyl phosphate, monophenyl phosphate, and monobenzyl phosphate.

According to an example embodiment, the organic salt containing the sulfuric acid group may include at least one selected from a group consisting of sulfate, alkyl sulfate, polyoxyethylene arylethersulfate, polyoxyalkylene alkylsulfate, and polyoxyalkylene alkylphenylsulfate.

According to an example embodiment, the organic salt may be present in an amount of 0.1% by weight (wt %) to 10 wt % in the cleaning liquid composition.

According to an example embodiment, the cleaning liquid composition may further include an auxiliary chelating agent including an organic acid. The organic acid may be present in an amount of 0.1 wt % to 10 wt % in the cleaning liquid composition.

According to an example embodiment, the organic acid may include at least one selected from a group consisting of an organic acid containing a carboxyl group, an organic acid containing a sulfone group, and an organic acid containing a phosphoric acid group.

According to an example embodiment, the organic acid containing the carboxyl group may include at least one selected from a group consisting of malic acid, malonic acid, adipic acid, succinic acid, tartaric acid, glutaric acid, glycollic acid, aspartic acid, itaconic acid, glutamic acid, tricarballylic acid, pimelic acid, suberic acid, sebacic acid, stearic acid, pyruvic acid, acetoacetic acid, glyoxylic acid, azelaic acid, fumaric acid, glutaconic acid, traumatic acid, muconic acid, aconitic acid, carballylic acid, tribasic acid, mellitic acid, isocitric acid, citric acid, lactic acid, gluconic acid, maleic acid, ascorbic acid, iminoacetic acid, oxalic acid, pyrogallic acid, formic acid, acetic acid, propionic acid, butyric acid, valeric acid, hexanoic acid, heptanoic acid, caprylic acid, nonanoic acid, decanoic acid, undecylenic acid, lauric acid, tridecylic acid, myristic acid, pentadecanoic acid, and palmitic acid.

According to an example embodiment, the organic acid containing the sulfone group may include at least one selected from a group consisting of sulfamic acid, p-toluenesulfonic acid, polystyrenesulfonic acid, 2-naphthalene sulfonic acid, dodecylbenezenesulfonic acid, polyvinylsulfonic acid (polyvinylsulfonate), anthraquinonesulfonic acid, 4-hydroxybenzenesulfonic acid, methylsulfonic acid, and nitrobenzenesulfonic acid.

According to an example embodiment, the organic acid containing the phosphoric acid group may include at least one selected from a group consisting of ethylidenediphosphonic acid, 1-hydroxyethylidene-1,1'-diphosphonic acid (HEDPO), 1-hydroxypropylidene-1,1'-diphosphonic acid, 1-hydroxybutylidene-1,1'-diphosphonic acid, ethylaminobis(methylenephosphonic acid), dodecylaminobis(methylenephosphonic acid), 2-phosphono-butane-1,2,4-tricarboxylic acid (PBTC), nitrilotris(methylenephosphonic acid) (NTPO), ethylenediaminebis(methylenephosphonic acid) (EDDPO), 1,3-propylenediaminebis(methylenephosphonic acid), ethylenediaminetetra(methylenephosphonic acid) (EDTPO), ethylenediaminetetra(ethylenephosphonic acid), 1,3-propylenediaminetetra(methylenephosphonic acid) (PDTMP), 1,2-diaminopropanetetra(methylenephosphonic acid), 1,6-hexamethylenediaminetetra(methylenephosphonic acid), hexadiaminetetra(methylenephosphonic acid), diethylenetriaminepenta(methylenephosphonic acid) (DEPPO), diethylenetriaminepentakis(methylphosphonic acid), N,N,N',N'-ethylenediaminetetra(methylenephosphonic acid), diethylenetriaminepenta(ethylenephosphonic acid), triethylenetetraminehexa(methylenephosphonic acid), and triethylenetetraminehexa(ethylenephosphonic acid).

According to an example embodiment, the anionic surfactant may include a sulfuric acid group or a phosphoric acid group.

According to an example embodiment, the anionic surfactant including the sulfuric acid group may include at least one selected from a group consisting of alkyl aryl sulfonate, alkyl ether sulfonate, alkyl sulfonate, aryl sulfonate, polystyrene sulfonate, alkanesulfonate, α-olefin sulfonate, dodecylbenzenesulfonate, and alkylbenzene sulfonate.

According to an example embodiment, the anionic surfactant including the phosphoric acid group may include at least one selected from a group consisting of alkyl aryl phosphate, alkyl ether phosphate, aryl ether phosphate, alkyl phosphate, aryl phosphate, and benzene phosphate.

According to an example embodiment, the anionic surfactant may be present in an amount of 0.1 wt % to 10 wt % in the cleaning liquid composition.

According to an example embodiment, pH of the cleaning liquid composition may range from 3 to 7.

According to an example embodiment, the cleaning liquid composition may be used to clean a surface of a wafer for a semiconductor device that includes a silicon nitride film, a silicon oxide film, or both, after polishing of the wafer.

According to an example embodiment, when cleaning is performed using the cleaning liquid composition, a defect reduction rate for a silicon nitride film may be 75% or greater, and a defect reduction rate for a silicon oxide film may be 50% or greater.

According to another aspect of the present disclosure, there is provided a cleaning method, wherein a wafer for a semiconductor device is cleaned using the cleaning liquid composition according to the aspect after chemical mechanical polishing (CMP) of the wafer.

Effects

A cleaning liquid composition according to an aspect of the present disclosure may facilitate a removal of residual abrasive particles and surface defects in a cleaning process after chemical mechanical polishing (CMP) of a wafer for a semiconductor device. Also, it may be possible to sufficiently remove contaminants such as organic materials, impurities, and the like that remain after polishing of a semiconductor wafer.

By a cleaning method according to another aspect of the present disclosure, it may be possible to facilitate a removal of residual abrasive particles and surface defects in a cleaning process after CMP of a wafer for a semiconductor device.

BEST MODE FOR CARRYING OUT THE INVENTION

Hereinafter, example embodiments of the present disclosure will be described in detail with reference to the accompanying drawings. However, various alterations and modifications may be made to the example embodiments. Here, the example embodiments are not construed as limited to the disclosure and should be understood to include all changes, equivalents, and replacements within the idea and the technical scope of the disclosure.

The terminology used herein is for the purpose of describing particular example embodiments only and is not to be limiting of the example embodiments. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related technologies will be omitted when it is deemed that such description will cause ambiguous interpretation of the present disclosure.

Hereinafter, a cleaning liquid composition and a cleaning method using the cleaning liquid composition according to the present disclosure will be described in detail with reference to example embodiments and drawings. However, the present disclosure is not limited to the example embodiments and drawings.

According to an aspect of the present disclosure, there is provided a cleaning liquid composition including: a chelating agent including an organic salt; and an anionic surfactant.

The cleaning liquid composition according to the aspect of the present disclosure may facilitate a removal of residual abrasive particles and surface defects in a cleaning process after chemical mechanical polishing (CMP) of a wafer for a semiconductor device. Also, it may be possible to sufficiently remove contaminants such as organic materials, impurities, and the like that remain after polishing of a semiconductor wafer.

According to an example embodiment, the chelating agent may be used to prevent a wafer for a semiconductor device from being contaminated by a metal. Using the chelating agent, a metal ion present in a polishing slurry composition may react with the chelating agent to form a complex ion, thereby effectively preventing a metal contamination on a surface of a silicon wafer. For example, the chelating agent may react with a cerium ion from ceria abrasive particles to form a complex compound, thereby easily removing abrasive particles.

According to an example embodiment, the chelating agent may include at least one organic salt selected from a group consisting of a carboxyl group, a carbonic acid group, a phosphoric acid group, and a sulfuric acid group; or an ammonium salt thereof. The organic salt may enhance an effect of removing fine abrasive particles, metal impurities, and the like remaining on a wafer for a semiconductor device.

According to an example embodiment, the organic salt containing the carboxyl group may include at least one selected from a group consisting of acetate, citrate, hydrogen citrate, tartrate, oxalate, lactate, benzonate, formate, phthalate, and malate.

According to an example embodiment, the organic salt containing the carbonic acid group may include at least one selected from a group consisting of carbonate, bicarbonate, tricarboante, ethylcarbonate, 2-cyanoethylcarbonate, octadecylcarbonate, dibutylcarbonate, dioctadecylcarbonate, methyldecylcarbonate, hexamethylene iminecarbonate, mopholinium morpholinecarbonate, benzylcarbonate, triethoxy silylpropylcarbonate, pyridinium ethylhexyl bicarbonate (pyridinium ethylhexylcarbonate), and triethylene diaminium bicarbonate.

According to an example embodiment, the organic salt containing the phosphoric acid group may include at least one selected from a group consisting of phosphate, hydrogen phosphate, diammonium hydrogen phosphate, triammonium hydrogen phosphate, monobutyl phosphate, monoamyl phosphate, monononyl phosphate, monocetyl phosphate, monophenyl phosphate, and monobenzyl phosphate.

According to an example embodiment, the organic salt containing the sulfuric acid group may include at least one selected from a group consisting of sulfate, alkyl sulfate, polyoxyethylene arylethersulfate, polyoxyalkylene alkylsulfate, and polyoxyalkylene alkylphenylsulfate.

According to an example embodiment, the ammonium salt may include one to three ammonium groups.

According to an example embodiment, the organic salt may be present in an amount of 0.1% by weight (wt %) to 10 wt % in the cleaning liquid composition. When the amount of the organic salt in the cleaning liquid composition is less than 0.1 wt %, a function for chelation of abrasive particles may be lowered. When the amount of the organic salt exceeds 10 wt %, that is, when an excess amount of organic salt is added, the organic salt may remain on a surface of a wafer, which may lead to an occurrence of defects.

According to an example embodiment, to further enhance a chelating function, the cleaning liquid composition may further include an auxiliary chelating agent including an organic acid.

According to an example embodiment, the organic acid may perform a function of maintaining the cleaning liquid composition in a buffer state to secure a stability of performance of the cleaning liquid composition.

According to an example embodiment, the organic acid may include at least one selected from a group consisting of an organic acid containing a carboxyl group, an organic acid containing a sulfone group, and an organic acid containing a phosphoric acid group.

According to an example embodiment, the organic acid containing the carboxyl group may include at least one selected from a group consisting of malic acid, malonic acid, adipic acid, succinic acid, tartaric acid, glutaric acid, glycollic acid, aspartic acid, itaconic acid, glutamic acid, tricarballylic acid, pimelic acid, suberic acid, sebacic acid, stearic acid, pyruvic acid, acetoacetic acid, glyoxylic acid, azelaic acid, fumaric acid, glutaconic acid, traumatic acid, muconic acid, aconitic acid, carballylic acid, tribasic acid, mellitic acid, isocitric acid, citric acid, lactic acid, gluconic acid, maleic acid, ascorbic acid, iminoacetic acid, oxalic acid, pyrogallic acid, formic acid, acetic acid, propionic acid, butyric acid, valeric acid, hexanoic acid, heptanoic acid, caprylic acid, nonanoic acid, decanoic acid, undecylenic acid, lauric acid, tridecylic acid, myristic acid, pentadecanoic acid, and palmitic acid.

According to an example embodiment, the organic acid containing the sulfone group may include at least one selected from a group consisting of sulfamic acid, p-toluenesulfonic acid, polystyrenesulfonic acid, 2-naphthalene sulfonic acid, dodecylbenezenesulfonic acid, polyvinylsulfonic acid (polyvinylsulfonate), anthraquinonesulfonic acid, 4-hydroxybenzenesulfonic acid, methylsulfonic acid, and nitrobenzenesulfonic acid.

According to an example embodiment, the organic acid containing the phosphoric acid group may include at least one selected from a group consisting of ethylidenediphosphonic acid, 1-hydroxyethylidene-1,1'-diphosphonic acid (HEDPO), 1-hydroxypropylidene-1,1'-diphosphonic acid, 1-hydroxybutylidene-1,1'-diphosphonic acid, ethylaminobis (methylenephosphonic acid), dodecylaminobis(methylenephosphonic acid), 2-phosphono-butane-1,2,4-tricarboxylic acid (PBTC), nitrilotris(methylenephosphonic acid) (NTPO), ethylenediaminebis(methylenephosphonic acid) (EDDPO), 1,3-propylenediaminebis(methylenephosphonic acid), ethylenediaminetetra(methylenephosphonic acid) (EDTPO), ethylenediaminetetra(ethylenephosphonic acid), 1,3-propylenediaminetetra(methylenephosphonic acid) (PDTMP), 1,2-diaminopropanetetra(methylenephosphonic acid), 1,6-hexamethylenediaminetetra(methylenephosphonic acid), hexadiaminetetra(methylenephosphonic acid), diethylenetriaminepenta(methylenephosphonic acid) (DEPPO), diethylenetriaminepentakis(methylphosphonic acid), N,N,N',N'-ethylenediaminetetra(methylenephosphonic acid), diethylenetriaminepenta(ethylenephosphonic acid), triethylenetetraminehexa(methylenephosphonic acid), and triethylenetetraminehexa(ethylenephosphonic acid).

According to an example embodiment, the organic acid may be present in an amount of 0.1 wt % to 10 wt % in the cleaning liquid composition. When the amount of the organic acid in the cleaning liquid composition is less than 0.1 wt %, a function for chelation of abrasive particles may be lowered, which may cause an effect of removing residual abrasive particles to fall short of expectations. When the amount of the organic acid exceeds 10 wt %, that is, when an excess amount of organic acid is added, the organic acid may remain on a surface of a wafer, which may lead to an occurrence of defects.

According to an example embodiment, the anionic surfactant may be electrically adsorbed to particles by lowering a zeta potential to remove the particles from a substrate, and may prevent the particles from being adsorbed onto a surface of the substrate again, so as to exhibit an excellent cleaning effect. In particular, the anionic surfactant may improve defects and cleaning for a hydrophilic film such as a silicon nitride film and a silicon oxide film.

According to an example embodiment, the anionic surfactant may include a sulfuric acid group or a phosphoric acid group.

According to an example embodiment, the anionic surfactant including the sulfuric acid group may include at least one selected from a group consisting of alkyl aryl sulfonate, alkyl ether sulfonate, alkyl sulfonate, aryl sulfonate, polystyrene sulfonate, alkanesulfonate, α-olefin sulfonate, dodecylbenzenesulfonate, and alkylbenzene sulfonate.

According to an example embodiment, the anionic surfactant including the phosphoric acid group may include at least one selected from a group consisting of alkyl aryl phosphate, alkyl ether phosphate, aryl ether phosphate, alkyl phosphate, aryl phosphate, and benzene phosphate.

According to an example embodiment, the anionic surfactant may further include ethylene oxide or propylene oxide.

According to an example embodiment, the anionic surfactant may be present in an amount of 0.1 wt % to 10 wt % in the cleaning liquid composition. When the amount of the anionic surfactant in the cleaning liquid composition is less than 0.1 wt %, the anionic surfactant may not be sufficiently adsorbed to particles due to a small amount thereof, which may make it impossible to electrically remove the particles. Even when an excess amount of the anionic surfactant that exceeds 10 wt % is used, it is not economically desirable because a further effect is not obtained, and a problem of remaining on a surface may also occur.

According to an example embodiment, pH of the cleaning liquid composition may range from 3 to 7. When the pH is within the above range, and when a chemically mechanically polished wafer is treated with the cleaning liquid composition, an excellent cleaning effect and fewer defects may be provided in a subsequent cleaning process. Also, contaminants such as abrasive particles, organic materials, impurities, and the like that remain after polishing of a semiconductor wafer may be sufficiently removed.

According to an example embodiment, the cleaning liquid composition may further include a pH adjusting agent. In the present disclosure, the cleaning liquid composition with pH of 3 to 7 may be prepared even without a pH adjusting agent.

According to an example embodiment, the pH adjusting agent may include alkyl amine.

According to an example embodiment, the pH adjusting agent may include at least one selected from a group consisting of monoethanolamine, diethanolamine, triethanolamine, monoisopropanolamine, diisopropanolamine, triisopropanolamine, dimethylmonoethanolamine, ethyldiethanolamine, diethylmonoethanolamine, methylethanolamine, ethylethanolamine, N-amino-N-propanol, methylamine, dimethylamine, trimethylamine, ethylamine, diethylamine, triethylamine, ethylenediamine, monoethanolamine, N-(βaminoethyl)ethanolamine, hexamethylenediamine, diethylenetriamine, triethylenetetramine, tetraethylenepentamine, octylamine, dodecylamine, hexadecylamine, 2-aminopropanol, 2-(methylphenylamino)ethanol, 2-(ethylphenylamino)ethanol, 2-amino-1-butanol, (diisopropylamino)ethanol, 2-diethylaminoethanol, 4-aminophenylaminoisopropanol, and N-ethylaminoethanolmethyldiethanolamine.

According to an example embodiment, the cleaning liquid composition may include a solvent, and the solvent may include water, and/or an organic solvent. The water in the cleaning liquid composition may function to dissolve or disperse the other components included in the cleaning liquid composition. It is desirable that the water does not contain, as much as possible, impurities that inhibit actions of the other components. Specifically, ion-exchange water, from which foreign matter is removed by being passed through a filter after removing impurity ions with an ion-exchange resin, pure water, ultrapure water, or distilled water may be desirable.

According to an example embodiment, the cleaning liquid composition may be used to clean a surface of a wafer for a semiconductor device that includes a silicon nitride film, a silicon oxide film, or both, after polishing of the wafer.

According to an example embodiment, when a defect level of a wafer (a silicon nitride film and a silicon oxide film) cleaned using a hydrofluoric acid and SC1 according to a related art is set as 100% as a criterion, a defect level for the silicon nitride film cleaned with the cleaning liquid composition may be 25% or less compared to the criterion, and a defect level for the silicon oxide film may be 50% or less compared to the criterion.

When the defect level is expressed as a defect reduction rate, a defect reduction rate for the silicon nitride film may be 75% or greater based on defects measured when cleaning is performed using the hydrofluoric acid and SC1, and a defect reduction rate for the silicon oxide film may be 50% or greater based on the defects measured when the cleaning is performed using the hydrofluoric acid and SC1. The defect reduction rate may be an index indicating a degree to which defects are reduced when cleaning is performed using the cleaning liquid composition according to an example embodiment of the present disclosure, in comparison to defects measured when cleaning is performed using the hydrofluoric acid and SC1 that are cleaning liquid compositions according to the related art. The SC1 may be a generally used cleaning liquid, and may refer to standard cleaning 1 (SC1) that is a mixed cleaning solution of ammonia water, hydrogen peroxide, and water.

According to an example embodiment, the above residues may include a material selected from a group consisting of CMP slurry-derived particles, a chemical material present in a CMP slurry, a reaction by-product of a CMP slurry, carbon-rich particles, polishing pad particles, brush deloading particles, equipment materials of constituent particles, a metal, metal oxide, and a combination thereof.

According to another aspect of the present disclosure, a cleaning method may be provided, and a wafer for a semiconductor device may be cleaned using the cleaning liquid composition according to the aspect after CMP of the wafer.

According to an example embodiment, the cleaning liquid composition may be in direct contact with a wafer for a semiconductor device to clean the wafer on the same apparatus and condition as those used in typical cleaning of a wafer.

According to an example embodiment, in the cleaning method, the cleaning liquid composition of the present disclosure may be used alone, or the cleaning liquid composition of the present disclosure and a hydrofluoric acid (1%) may be mixed and used. By the cleaning method of the present disclosure, an effect greater than performing a cleaning process using a hydrofluoric acid and SC1 that are typically used according to the related art may be obtained. Also, an excellent cleaning effect may be obtained even though sulfuric acid peroxide mixture (SPM) cleaning that is a last step of a cleaning process according to the related art is not performed, thereby reducing a number of steps of a cleaning process. Thus, the cleaning method may be economical.

By a cleaning method according to an aspect of the present disclosure, it is possible to facilitate a removal of residual abrasive particles and surface defects in a cleaning process after CMP of a wafer for a semiconductor device.

Hereinafter, the present disclosure will be described in detail with reference to examples and comparative examples. However, the technical idea of the present disclosure is not limited or restricted thereto.

Wafer Defect Measurement

CMP was performed on a silicon oxide film wafer and a silicon nitride film wafer using a slurry composition including cerium oxide having a diameter of 100 nm as abrasive particles. The polished silicon oxide film wafer and the polished silicon nitride film wafer were cleaned using a 1% hydrofluoric acid for 5 seconds, and were cleaned for 30 seconds with a cleaning liquid composition according to the present disclosure at a flow rate of 1000 milliliters per minute (ml).

After the cleaning was completed, rinsing with deionized water (DIW) and drying were conducted, and then defects of each of the silicon oxide film wafer and the silicon nitride film wafer were checked using defect measurement equipment (manufactured by KLA-Tencor).

[Defect Evaluation Criterion]

Defects measured for each of the silicon oxide film wafer and the silicon nitride film wafer after cleaning with 1% hydrofluoric acid for 5 seconds and cleaning using an SC1 solution, were used as a criterion.

Here, as the SC1 solution, an ammonia and hydrogen peroxide mixture (APM) ($NH_4OH:H_2O_2:H_2O$) was used.

About "13,174" defects (≥53 nm) of the silicon nitride film wafer, and about "962" (≥63 nm) defects of the silicon oxide film wafer were observed.

Defects measured when cleaning was performed using cleaning liquid compositions of Examples 1 to 43 are expressed as a percentage (%) compared to defects measured when cleaning was performed using a hydrofluoric acid (1%) and SC1, as shown in Table 1 below.

Examples 1 to 43

The cleaning liquid compositions of Examples 1 to 43 were prepared by compositions shown in Table 1 below.

Tables 1 and 2 show detailed compositions and concentrations of the cleaning liquid compositions of Examples 1 to 43. Table 3 shows types of organic acids, organic salts and anionic surfactants represented by numerals in Tables 1 and 2.

TABLE 1

| | Compositions | | | | | | | | | Defect Cleaning with 1% hydrofluoric acid (5")+ Cleaning with cleaning liquid of the present disclosure (30") | |
|---|---|---|---|---|---|---|---|---|---|---|---|
| | Auxiliary chelating agent | | | | Chelating agent | | | | Surfactant | | |
| | Organic acid | | | | Organic salt | | | | Anion | | Nitride | Oxide |
| | | | Concentration | | | | Concentration | | | Concentration | Less than 25% | Less than 50% |
| | Type | | | | Type | | | | Type | | | |
| | A | B | A% | B% | A | B | A% | B% | A | A% | %/Criterion | %/Criterion |
| Criterion | Cleaning with hydrofluoric acid + Cleaning with SC1 | | | | | | | | | | 100% | 100% |
| Ex. 1 | 2 | 4 | 3.0 | 1.0 | 11 | | 3.0 | | 4 | 3.0 | 11% | 37% |
| Ex. 2 | 2 | 4 | 7.0 | 1.0 | 11 | | 1.0 | | 7 | 5.0 | 7% | 37% |
| Ex. 3 | 1 | | 7.0 | | 1 | | 10.0 | | 4 | 10.0 | 11% | 40% |
| Ex. 4 | 2 | | 3.0 | | 3 | | 10.0 | | 5 | 7.0 | 7% | 42% |
| Ex. 5 | 2 | | 10.0 | | 4 | | 1.0 | | 6 | 10.0 | 8% | 40% |
| Ex. 6 | 2 | | 7.0 | | 5 | | 3.0 | | 8 | 5.0 | 10% | 32% |
| Ex. 7 | 2 | | 3.0 | | 1 | 3 | 1.0 | 3.0 | 1 | 3.0 | 2% | 37% |
| Ex. 8 | 2 | | 10.0 | | 4 | 9 | 3.0 | 3.0 | 4 | 5.0 | 3% | 22% |
| Ex. 9 | 2 | | 7.0 | | 5 | 11 | 3.0 | 3.0 | 8 | 5.0 | 5% | 33% |
| Ex. 10 | 2 | 3 | 7.0 | 3.0 | 1 | 3 | 1.0 | 3.0 | 5 | 7.0 | 6% | 34% |
| Ex. 11 | 2 | 4 | 3.0 | 1.0 | 5 | 11 | 1.0 | 3.0 | 8 | 3.0 | 12% | 42% |
| Ex. 12 | 2 | 6 | 10.0 | 3.0 | 9 | 4 | 1.0 | 3.0 | 1 | 10.0 | 7% | 33% |
| Ex. 13 | 2 | 3 | 3.0 | 3.0 | 1 | | 3.0 | | 2 | 5.0 | 5% | 21% |
| Ex. 14 | 2 | 4 | 7.0 | 1.0 | 5 | | 1.0 | | 8 | 5.0 | 5% | 32% |
| Ex. 15 | 2 | 7 | 7.0 | 1.0 | 7 | | 1.0 | | 4 | 3.0 | 5% | 33% |
| Ex. 16 | 2 | 5 | 3.0 | 3.0 | 8 | | 10. | | 6 | 7.0 | 10% | 37% |
| Ex. 17 | 2 | 6 | 10.0 | 3.0 | 9 | | 7.0 | | 5 | 10.0 | 11% | 50% |

TABLE 2

| | Compositions | | | | | | | Defect Cleaning with 1% hydrofluoric acid (5")+ Cleaning with cleaning liquid of the present disclosure (30") | |
|---|---|---|---|---|---|---|---|---|---|
| | Auxiliary chelating agent | | | | Chelating agent | | Surfactant | | |
| | Organic acid | | | | Organic salt | | Anion | Nitride | Oxide |
| | Type | | Concentration | | Type | Concentration | Type | Concentration | Less than 25% | Less than 50% |
| Criterion | A | B | A% | B% | A | B | A% | B% | A | A% | %/Criterion 100% | %/Criterion 100% |
| | Cleaning with hydrofluoric acid + Cleaning with SC1 | | | | | | | | | | | |
| Ex. 18 | | | | | 1 | 3 | 1.0 | 1.0 | 2 | 3.0 | 12% | 28% |
| Ex. 19 | | | | | 3 | 4 | 3.0 | 1.0 | 5 | 5.0 | 13% | 26% |
| Ex. 20 | | | | | 4 | 9 | 7.0 | 1.0 | 6 | 7.0 | 13% | 44% |
| Ex. 21 | | | | | 4 | 5 | 10.0 | 1.0 | 8 | 10.0 | 14% | 25% |
| Ex. 22 | | | | | 5 | 6 | 1.0 | 1.0 | 6 | 3.0 | 9% | 50% |
| Ex. 23 | | | | | 1 | 5 | 7.0 | 1.0 | 5 | 5.0 | 10% | 45% |
| Ex. 24 | | | | | 5 | 11 | 10.0 | 1.0 | 8 | 5.0 | 10% | 40% |
| Ex. 25 | | | | | 2 | 7 | 3.0 | 1.0 | 2 | 10.0 | 10% | 35% |
| Ex. 26 | | | | | 1 | | 3.0 | | 4 | 3.0 | 5% | 43% |
| Ex. 27 | | | | | 1 | | 5.0 | | 5 | 5.0 | 9% | 34% |
| Ex. 28 | | | | | 1 | | 7.0 | | 6 | 7.0 | 5% | 44% |
| Ex. 29 | | | | | 1 | | 10.0 | | 8 | 10.0 | 6% | 33% |
| Ex. 30 | | | | | 3 | | 3.0 | | 1 | 10.0 | 6% | 43% |
| Ex. 31 | | | | | 3 | | 5.0 | | 5 | 3.0 | 7% | 38% |
| Ex. 32 | | | | | 3 | | 7.0 | | 2 | 7.0 | 8% | 41% |
| Ex. 33 | | | | | 3 | | 10.0 | | 8 | 3.0 | 13% | 37% |
| Ex. 34 | | | | | 4 | | 3.0 | | 4 | 10.0 | 8% | 36% |
| Ex. 35 | | | | | 4 | | 5.0 | | 3 | 3.0 | 6% | 34% |
| Ex. 36 | | | | | 4 | | 7.0 | | 6 | 7.0 | 8% | 43% |
| Ex. 37 | | | | | 4 | | 10.0 | | 8 | 5.0 | 13% | 45% |
| Ex. 38 | | | | | 5 | | 3.0 | | 4 | 10.0 | 12% | 46% |
| Ex. 39 | | | | | 5 | | 5.0 | | 5 | 3.0 | 9% | 38% |
| Ex. 40 | | | | | 5 | | 7.0 | | 6 | 7.0 | 10% | 38% |
| Ex. 41 | | | | | 5 | | 10.0 | | 8 | 5.0 | 7% | 49% |
| Ex. 42 | | | | | 9 | | 3.0 | | 5 | 3.0 | 10% | 45% |
| Ex. 43 | | | | | 10 | | 5.0 | | 5 | 10.0 | 14% | 36% |

TABLE 3

| No. | Organic acid | Organic salt | Anionic surfactant |
|---|---|---|---|
| 1 | Ascorbic acid | Ammonium acetate | Alkyl aryl sulfonate |
| 2 | Citric acid | Ammonium benzonate | Alkyl ether sulfonate |
| 3 | Glutamic acid | Ammonium bicarbonate | Alkyl sulfonate |
| 4 | HEDPO | Ammonium Carbonate | Polyoxyethylene alkyl aryl sulfonate |
| 5 | Lactic acid | Ammonium Citrate | Alkylbenzene sulfonate |
| 6 | Maleic acid | Ammonium Formate | Polyoxyethylene aryl ether phosphate |
| 7 | EDTPO | Ammonium hydrogen citrate | Polyoxyethylene aryl ether sulfate |
| 8 | | Ammonium nitrate | Polystyrene sulfonate |
| 9 | | Ammonium sulfate | |
| 10 | | Ammonium Tartrate | |
| 11 | | Diammonium Hydrogen phosphate | |

Referring to Table 1, when cleaning was performed using the cleaning liquid compositions of Examples 1 to 43, defects of the silicon nitride film compared to the criterion were reduced to be less than 25%, and defects of the silicon oxide film compared to the criterion were reduced to be less than 50%.

In the present disclosure, it may be found that a surface of a wafer on which CMP is performed is cleaned using a cleaning liquid composition including a chelating agent and an anionic surfactant, thereby facilitating a removal of defects and residues generated after the CMP.

While this disclosure includes specific example embodiments, it will be apparent to one of ordinary skill in the art that various changes in form and details may be made in these example embodiments without departing from the spirit and scope of the claims and their equivalents. The example embodiments described herein are to be considered in a descriptive sense only, and not for purposes of limitation. Descriptions of features or aspects in each example embodiment are to be considered as being applicable to similar features or aspects in other example embodiments. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is not limited by the detailed description, but further supported by the claims and their equivalents, and all variations within the scope of the claims and their equivalents are to be construed as being included in the disclosure.

The invention claimed is:

1. A cleaning liquid composition comprising:
a chelating agent comprising an organic salt;
an anionic surfactant;
an auxiliary chelating agent comprising an organic acid, wherein the chelating agent comprises:
- at least one organic salt selected from the group consisting of ammonium acetate, ammonium bicarbonate, ammonium carbonate, ammonium citrate, ammonium hydrogen citrate, ammonium sulfate, and diammonium hydrogen phosphate,
- wherein the anionic surfactant comprises alkyl aryl sulfonate, alkyl ether sulfonate, polyoxyethylene alkyl aryl sulfonate, or polystyrene sulfonate,
- wherein the auxiliary chelating agent comprises citric acid or a combination of citric acid and glutamic acid, 1-hydroxyethylidene-1,1'-diphosphonic acid (HEDPO), or ethylenediaminetetra(methylenephosphonic acid) (EDTPO).

2. The cleaning liquid composition of claim 1, wherein the organic salt is present in an amount of 0.1% by weight (wt %) to 10 wt % in the cleaning liquid composition.

3. The cleaning liquid composition of claim 1, wherein the organic acid is present in an amount of 0.1 wt % to 10 wt % in the cleaning liquid composition.

4. The cleaning liquid composition of claim 1, wherein the anionic surfactant is present in an amount of 0.1 wt % to 10 wt % in the cleaning liquid composition.

5. The cleaning liquid composition of claim 1, wherein pH of the cleaning liquid composition ranges from 3 to 7.

6. The cleaning liquid composition of claim 1, wherein the cleaning liquid composition is used to clean a surface of a wafer for a semiconductor device that includes a silicon nitride film, a silicon oxide film, or both, after polishing of the wafer.

7. The cleaning liquid composition of claim 6, wherein when cleaning is performed using the cleaning liquid composition, a defect reduction rate for a silicon nitride film is 75% or greater, and a defect reduction rate for a silicon oxide film is 50% or greater.

8. A cleaning method, wherein a wafer for a semiconductor device is cleaned using the cleaning liquid composition of claim 1 after chemical mechanical polishing (CMP) of the wafer.

* * * * *